(12) United States Patent
Park et al.

(10) Patent No.: US 11,508,681 B2
(45) Date of Patent: Nov. 22, 2022

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Soojae Park, Asan-si (KR); Younhee Kang, Asan-si (KR); Junghyun Roh, Asan-si (KR)

(73) Assignee: SAMSUNG ELECTRONICS CO., LTD., Suwon-si (KP)

( * ) Notice: Subject to any disclaimer, the term of this patent is extended or adjusted under 35 U.S.C. 154(b) by 0 days.

(21) Appl. No.: 16/988,136

(22) Filed: Aug. 7, 2020

(65) Prior Publication Data

US 2021/0043592 A1 Feb. 11, 2021

(30) Foreign Application Priority Data

Aug. 8, 2019 (KR) .......................... 10-2019-0096913

(51) Int. Cl.
*H01L 23/00* (2006.01)

(52) U.S. Cl.
CPC .............. *H01L 24/05* (2013.01); *H01L 24/13* (2013.01); *H01L 24/48* (2013.01); *H01L 2224/0221* (2013.01); *H01L 2224/0239* (2013.01); *H01L 2224/02206* (2013.01); *H01L 2224/02215* (2013.01); *H01L 2224/02311* (2013.01); *H01L 2224/02373* (2013.01); *H01L 2224/02375* (2013.01); *H01L 2224/02377* (2013.01); *H01L 2224/02381* (2013.01);
(Continued)

(58) Field of Classification Search
CPC ... H01L 2224/13024; H01L 2224/0239; H01L 2224/102373
See application file for complete search history.

(56) References Cited

U.S. PATENT DOCUMENTS 7,196,008 B1* 3/2007 Shiraiwa ........... H01L 21/76829
257/E21.18
9,293,403 B2 3/2016 Park et al.
(Continued)

FOREIGN PATENT DOCUMENTS

JP 2014-127649 A 7/2014

OTHER PUBLICATIONS

Yuriy Shlepnev, "How Interconnects Work: Modeling Conductor Loss and Dispersion", Signal Integrity Journal, Aug. 21, 2016, 21 pages total, www.signalintegrityjournal.com/articles/25-how-interconnects-work-modeling-conductor-loss-and-dispersion.
(Continued)

*Primary Examiner* — Dale E Page
*Assistant Examiner* — Wilner Jean Baptiste
(74) *Attorney, Agent, or Firm* — Sughrue Mion, PLLC

(57) ABSTRACT

A semiconductor package includes a semiconductor substrate, a conductive pad on the semiconductor substrate, a redistribution line conductor, a coating insulator, and an aluminum oxide layer. The redistribution line conductor is electrically connected to the conductive pad. The coating insulator covers the redistribution line conductor and partially exposes the redistribution line conductor. The aluminum oxide layer is provided below the coating insulator and extends along a top surface of the redistribution line conductor, and the aluminum oxide layer is in contact with the redistribution line conductor.

18 Claims, 17 Drawing Sheets

(52) U.S. Cl.
CPC ............... *H01L 2224/0401* (2013.01); *H01L 2224/04042* (2013.01); *H01L 2224/05569* (2013.01); *H01L 2224/13024* (2013.01); *H01L 2224/48227* (2013.01)

(56) References Cited

U.S. PATENT DOCUMENTS

| | | | |
|---|---|---|---|
| 9,330,994 | B2 | 5/2016 | Camacho et al. |
| 9,449,914 | B2 | 9/2016 | Ho et al. |
| 9,875,989 | B2 | 1/2018 | Kao et al. |
| 10,128,176 | B2 | 11/2018 | Paek et al. |
| 2007/0126030 | A1 | 6/2007 | Ito |
| 2016/0329275 | A1* | 11/2016 | Park ............... H01L 23/49827 |
| 2017/0170107 | A1* | 6/2017 | Paek ............... H01L 23/49816 |

OTHER PUBLICATIONS

H. Xu et al., "Behavior of aluminum oxide, intermetallics and voids in Cu—Al wire bonds", Acta Materialia, 59, ELSEVIER, 2011, pp. 5661-5673, 13 pages total.

Lau, "Recent Advances and New Trends in Semiconductor Packaging", IEEE/CMPT Society Lecture in the Santa Clara Valley, Apr. 12, 2016, pp. 1-49, 49 pages total.

Yuriy Shlepnev et al., "Nickel Characterization for Interconnect Analysis", IEEE, DOI: 10.1109/ISEMC.2011.6038368, Aug. 2011, pp. 524-529, 7 pages total.

Xiaoming Chen, "EM Modeling of Microstrip Conductor Losses Including Surface Roughness Effect", IEEE Microwave and Wireless Components Letters, vol. 17, No. 2, Feb. 2007, pp. 94-96, 3 pages total.

John Coonrod, "Ambiguous Influences Affecting Insertion Loss of Microwave Printed Circuit Boards", IEEE microwave magazine, Jul. 2012, pp. 66-75, 9 pages total.

"Finish Makes a Difference in Broadband PCB Loss", Microwave Journal, Sep. 28, 2015, 3 pages total, www.microwavejournal.com/blogs/1-rog-blog/post/25177-finish-makes-a-difference-in-broadband-pcb-loss.

J. Evertsson et al., "The thickness of native oxides on aluminum alloys and single crystals", Applied Surface Science, 349, ELSEVIER, May 2015, pp. 826-832, 8 pages.

Hagyoung Choi et al., "Moisture Barrier Properties of Al2O3 Films deposited by Remote Plasma Atomic Layer Deposition at Low Temperatures", Japanese Journal of Applied Physics, 52, 035502, Mar. 1, 2013, pp. 1-6, 7 pages total.

M. D. Groner et al., "Gas diffusion barriers on polymers using Al2O3 atomic layer deposition", Applied Physics Letters 88, 051907, doi: 10.1063/1.2168489, Jan. 31, 2006, pp. 1-3, 4 pages total.

Sang-Hee Ko Park et al., "Ultra Thin Film Encapsulation of OLED on Plastic Substrate", Journal of Information Display, vol. 5, No. 3, 2004, pp. 30-34, 6 pages total.

M. Petzold et al., "Surface oxide films on Aluminum bondpads: Influence on thermosonic wire bonding behavior and hardness", Microelectronics Reliability, 40, 2000, pp. 1515-1520, 6 pages total.

Nilesh Badwe et al., "Interfacial fracture strength and toughness of copper/epoxy-resin interfaces", Acta Materialia, 103, ELSEVIER, 2016, pp. 512-518, 7 pages total.

Jiong Liu et al., "Fracture behavior of an epoxy/aluminum interface reinforced by sol—gel coatings", J. Adhesion Sci. Technol., vol. 20, No. 4, Jan. 15, 2006, pp. 277-305, 29 pages total.

* cited by examiner

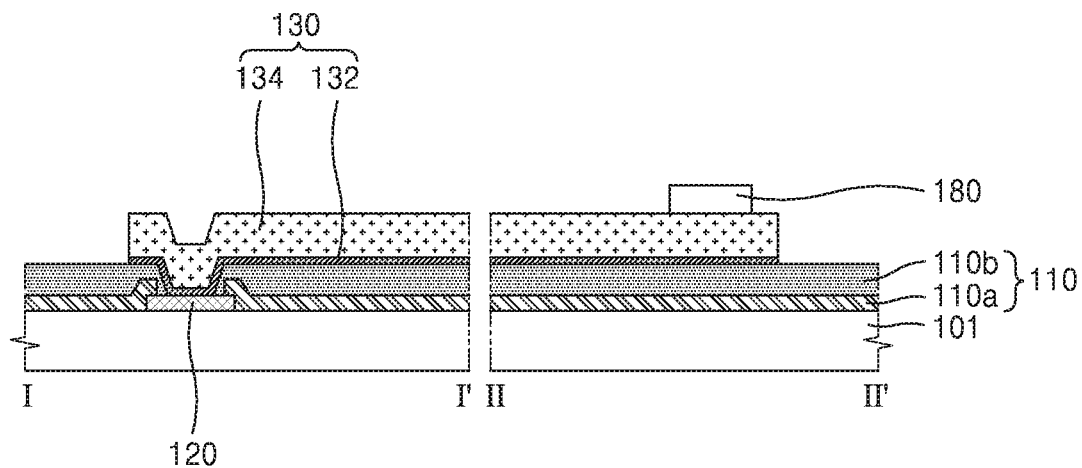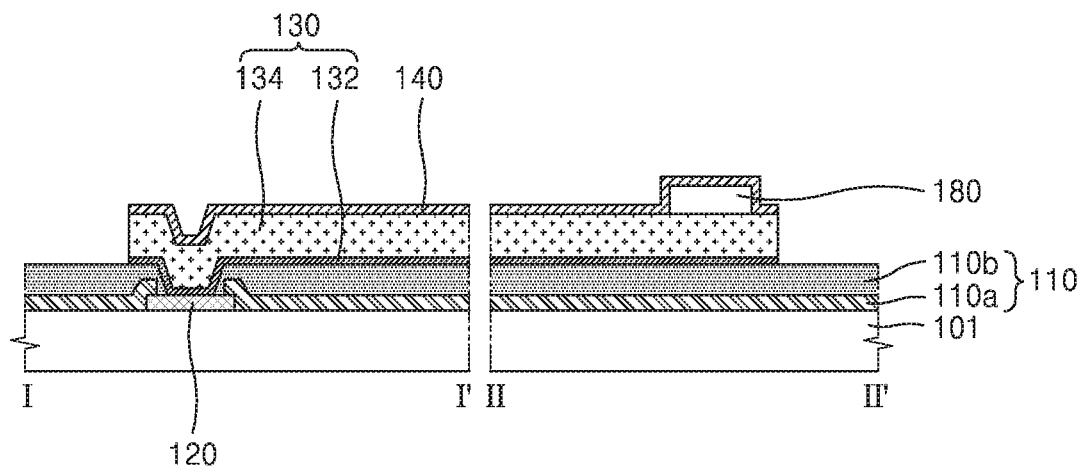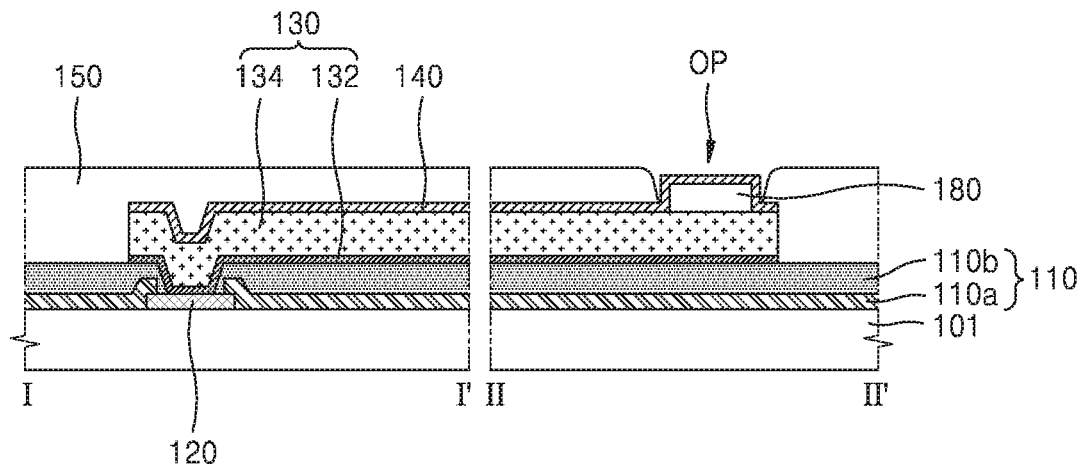

SEMICONDUCTOR PACKAGE AND METHOD OF FABRICATING THE SAME

CROSS-REFERENCE TO RELATED APPLICATION

This application claims priority from Korean Patent Application No. 10-2019-0096913, filed on Aug. 8, 2019, in the Korean Intellectual Property Office, the disclosure of which is incorporated by reference herein in its entirety.

BACKGROUND

1. Field

The present disclosure relates to a semiconductor package and a method of fabricating the same, and more particularly, to a semiconductor package, which has low resistance and high reliability and is fabricable at low cost, and a method of fabricating the same.

2. Description of Related Art

A material such as gold or aluminum is usually used for a redistribution line of a semiconductor package. However, since these materials are expensive and require complex processes and many constraints, further development has been performed. In particular, aluminum has relatively high resistivity, and therefore, it has been suggested to replace aluminum with another material. However, such replacement creates several disadvantages and problems which need to be overcome.

SUMMARY

It is an aspect to provide a semiconductor package which has low resistance and high reliability and is fabricable at low cost.

It is another aspect to provide a method of fabricating a semiconductor package which has low resistance and high reliability and is fabricable at low cost.

According to an aspect of an embodiment, there is provided a semiconductor package comprising a semiconductor substrate; a conductive pad on the semiconductor substrate; a redistribution line conductor electrically connected to the conductive pad; a coating insulator that covers the redistribution line conductor and partially exposes the redistribution line conductor; and an aluminum oxide layer provided below the coating insulator and extending along a top surface of the redistribution line conductor, the aluminum oxide layer being in contact with the redistribution line conductor.

According to another aspect of an embodiment, there is provided a semiconductor package comprising a semiconductor substrate; a conductive pad on the semiconductor substrate; a redistribution line conductor that is electrically connected to the conductive pad, the redistribution line conductor including copper; a coating insulator that covers the redistribution line conductor and partially exposes the redistribution line conductor; a conductive connector that contacts a portion of the redistribution line conductor that is exposed; and a metal oxide layer that is provided on the redistribution line conductor and that surrounds the conductive connector, wherein a metal of the metal oxide layer is different from a main component of the redistribution line conductor.

According to still another aspect of an embodiment, there is provided a semiconductor package comprising a semiconductor substrate; a conductive pad on the semiconductor substrate; a passivation layer that covers the semiconductor substrate and exposes the conductive pad; a copper redistribution line conductor that is electrically connected to the conductive pad and that extends on the passivation layer; a coating insulator that covers the copper redistribution line conductor and partially exposes the copper redistribution line conductor; an aluminum oxide layer on a portion of the copper redistribution line conductor that is exposed; and a conductive connector that contacts the portion of the copper redistribution line conductor that is exposed, wherein a thickness of the aluminum oxide layer is about 5 nm to about 12 nm.

According to an even another aspect of an embodiment, there is provided a method of manufacturing a semiconductor package, the method comprising forming a conductive pad on a semiconductor substrate; forming a passivation layer covering the semiconductor substrate and at least partially exposing the conductive pad; forming a redistribution line conductor electrically connected to the conductive pad; forming an aluminum oxide layer on at least a portion of the redistribution line conductor using physical vapor deposition (PVD); and forming a conductive connector on the redistribution line conductor.

According to a further aspect of an embodiment, there is provided a semiconductor package comprising a semiconductor substrate; a conductive pad on the semiconductor substrate; a passivation layer that covers the semiconductor substrate and exposes the conductive pad; a copper redistribution line conductor that is electrically connected to the conductive pad and that extends on the passivation layer; an aluminum oxide layer on a top surface of the passivation layer and on a top surface and side surfaces of the copper redistribution line conductor; a conductive connector that contacts a portion of the copper redistribution line conductor; and an encapsulation material that encapsulates the conductive connector, wherein a thickness of the aluminum oxide layer is about 5 nm to about 12 nm.

According to a further aspect of an embodiment, there is provided a semiconductor package comprising a semiconductor substrate; a conductive pad on the semiconductor substrate; a redistribution line conductor that is electrically connected to the conductive pad and that includes copper as a main component; and an aluminum oxide layer formed on the redistribution line conductor.

BRIEF DESCRIPTION OF THE DRAWINGS

Embodiments will be more clearly understood from the following detailed description taken in conjunction with the accompanying drawings, in which:

FIGS. 9A through 9H are lateral cross-sectional views of stages in a method of fabricating a first semiconductor device, taken along line I-I' and line II-IF in FIG. 2, according to an embodiment;

DETAILED DESCRIPTION OF THE EMBODIMENTS

Hereinafter, embodiments will be described with reference to the attached drawings.

Figure 1:
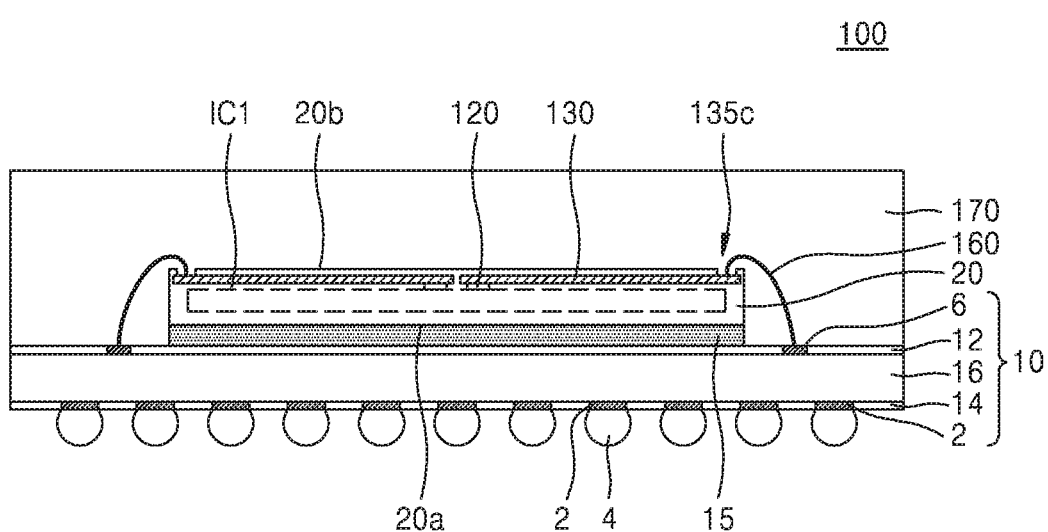
FIG. 1 is a cross-sectional view of a semiconductor package according to embodiments.
Figure 2:
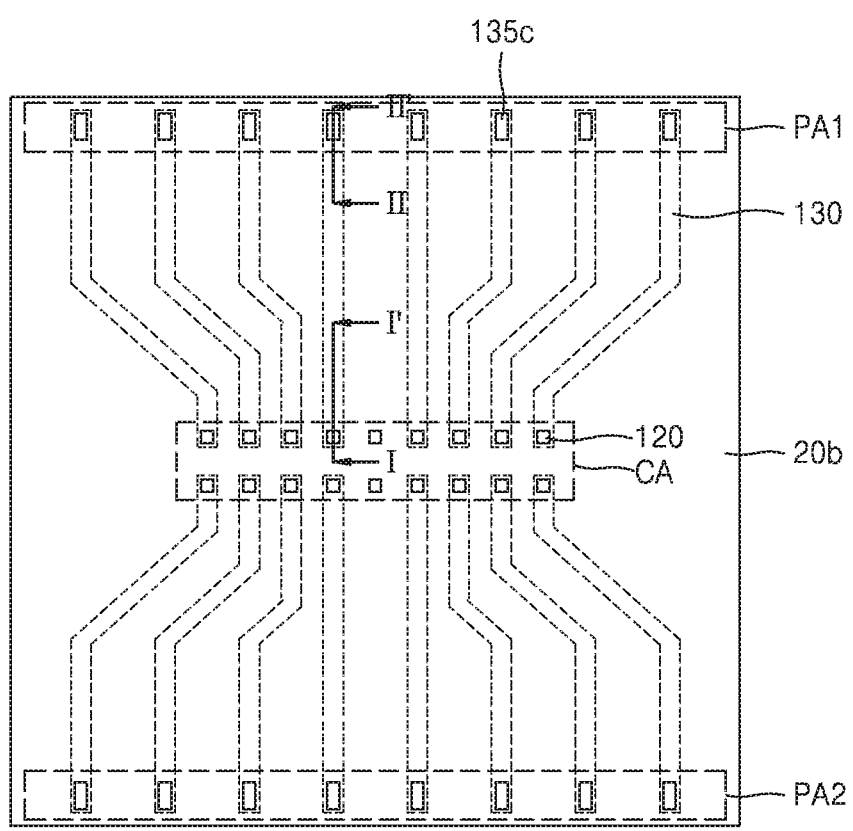
FIG. 2 is a plan view schematically showing a second surface of a first semiconductor device of the semiconductor package of FIG. 1, according to embodiments.
Figure 2:
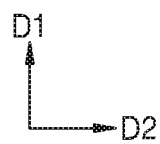

FIG. 1 is a cross-sectional view of a semiconductor package 100 according to embodiments. FIG. 2 is a plan view schematically showing a second side 20b of a first semiconductor device 20 of the semiconductor package 100, according to embodiments.

Referring to FIGS. 1 and 2, the first semiconductor device 20 may be mounted on a package substrate 10. In some embodiments, the package substrate 10 may include a printed circuit board (PCB). In some embodiments, the package substrate 10 may include a multi-layer PCB. In some embodiments, the package substrate 10 may include a core layer 16, one or more external pad 2, one or more internal pad 6, a top solder resist layer 12, and a lower solder resist layer 14.

The core layer 16 of the package substrate 10 may include at least one material selected from a phenol resin, an epoxy resin, and a polyimide. For example, the core layer 16 of the package substrate 10 may include at least one material selected from a flame retardant 4 (FR4), a tetrafunctional epoxy, a polyphenylene ether, an epoxy/polyphenylene oxide, a bismaleimide triazine (BT), a thermount, a cyanate ester, a polyimide, and a liquid crystal polymer.

The core layer 16 may include circuit patterns on the upper and lower surfaces thereof and therewithin. Some of the circuit patterns may be electrically connected to the one or more external pads 2 on the lower surface of the core layer 16. The top solder resist layer 12 exposing the one or more internal pads 6 may be formed on the top surface of the core layer 16, and a bottom solder resist layer 14 exposing the one or more external pads 2 may be formed on the bottom surface of the core layer 16. A conductive connector 160 may be connected to at least one of the internal pads 6. External terminals 4, such as a solder bump or a solder ball, which may be electrically connected to an external device, may be connected to the external pads 2, respectively.

The package substrate 10 may include a wiring patterns, which electrically connect the internal pads 6 to the external pads 2, and conductive vias, which electrically connect the wiring patterns to each other. The wiring patterns may be arranged on the top surface of the core layer 16, on the bottom surface of the core layer 16, and/or inside the core layer 16. For example, the wiring patterns may include a electrolytically deposited (ED) copper foil, a rolled-annealed (RA) copper foil, a stainless steel foil, an aluminum foil, an ultra-thin copper foil, a sputtered copper, or a copper alloy.

The conductive vias may at least partially penetrate the core layer 16. In some embodiments, the conductive vias may include copper, nickel, stainless steel, or beryllium copper.

The first semiconductor device 20 may include a first side 20a facing the package substrate 10 and the second side 20b opposite the first side 20a. As illustrated in FIG. 2, the first semiconductor device 20 may include a central area CA, a first peripheral area PA1, and a second peripheral area PA2. The central area CA may be located in approximately the middle of the second side 20b of the first semiconductor device 20. The first peripheral area PA1 and the second peripheral area PA2 may be respectively located near opposite edges of the first semiconductor device 20. For example, in some embodiments, the first peripheral area PA1 may be located at a first edge of the first semiconductor device 20, and the second peripheral area PA2 may be located at a second edge of the first semiconductor device 20, and the first and second edges may be opposite edges from each other. The central area CA may be between the first peripheral area PA1 and the second peripheral area PA2.

The first semiconductor device 20 may include a first integrated circuit IC1, conductive pads 120, and redistribution line conductors 130. As illustrated in FIG. 1, the first integrated circuit IC1 may be formed inside the first semiconductor device 20. In some embodiments, the first integrated circuit IC1 may be formed inside the first semiconductor device 20 near the second side 20b of the first semiconductor device 20. The conductive pads 120 may be electrically connected to the first integrated circuit IC1. In a plan view, the conductive pads 120 may be arranged in the central area CA, as illustrated in FIG. 2.

The redistribution line conductors 130 may be respectively arranged on the conductive pads 120. The redistribution line conductors 130 may respectively include pad portions 135c. The pad portions 135c may be electrically connected to the first integrated circuit IC1 through the conductive pads 120 and the redistribution line conductors 130. The pad portions 135c may be arranged in the first peripheral area PA1 and in the second peripheral area PA2. The pad portions 135c may be exposed to the outside. In other words, the redistribution line conductors 130 allow signals to be provided from the first peripheral area PA1 and the second peripheral area PA2 to the conductive pads 120 through the pad portions 135c.

The numbers and arrangement of the conductive pads 120 and the redistribution line conductors 130 are illustrated as examples, and embodiments are not limited to those illustrated in the drawings. Furthermore, in various embodiments, the numbers and arrangement of the conductive pads 120 and the redistribution line conductors 130 may be changed according to the type and purpose of a semiconductor package.

In some embodiments, the first semiconductor device 20 may include a central processing unit (CPU) chip, a graphics processing unit (GPU) chip, or an application processor (AP) chip. In some embodiments, the first semiconductor device 20 may include, for example, a dynamic random access memory (DRAM) chip, a static RAM (SRAM) chip, a flash memory chip, an electrically erasable and programmable read-only memory (EEPROM) chip, a phase-change RAM (PRAM) chip, a magnetic RAM (MRAM) chip, or a resistive RAM (RRAM) chip. In some embodiments, the first integrated circuit IC1 may include memory cells storing data, a control circuit controlling the operation of the memory cells, and/or a power supply circuit.

The first semiconductor device 20 may be attached to the package substrate 10 through a first adhesive layer 15. In some embodiments, the first semiconductor device 20 may be attached to the top solder resist layer 12 through the first adhesive layer 15. The first adhesive layer 15 may include a film such as an insulating film of epoxy or silicon, a non-conductive film (NCF), or a die attach film (DAF).

The conductive connector 160 may electrically connect a pad portion 135c of the first semiconductor device 20 to an internal pad 6 of the package substrate 10. The first semiconductor device 20 may communicate with a controller outside the first semiconductor device 20 through the conductive connector 160. A control signal including an address, a command, and so on, a voltage signal, and write data from the controller may be provided to the first semiconductor device 20 through the conductive connector 160. Data read from the memory cells of the first semiconductor device 20 may be provided to the controller through the conductive connector 160. Although FIG. 1 illustrates two conductive connectors 160, this is only an example for illustrative purposes, and embodiments may include more than two conductive connectors 160.

An encapsulation material 170 on the package substrate 10 may encapsulate the first semiconductor device 20 and the conductive connector 160. The encapsulation material 170 may protect the first semiconductor device 20 and the conductive connector 160. In some embodiments, the encapsulation material 170 may include an epoxy molding compound (EMC).

Figure 3A:
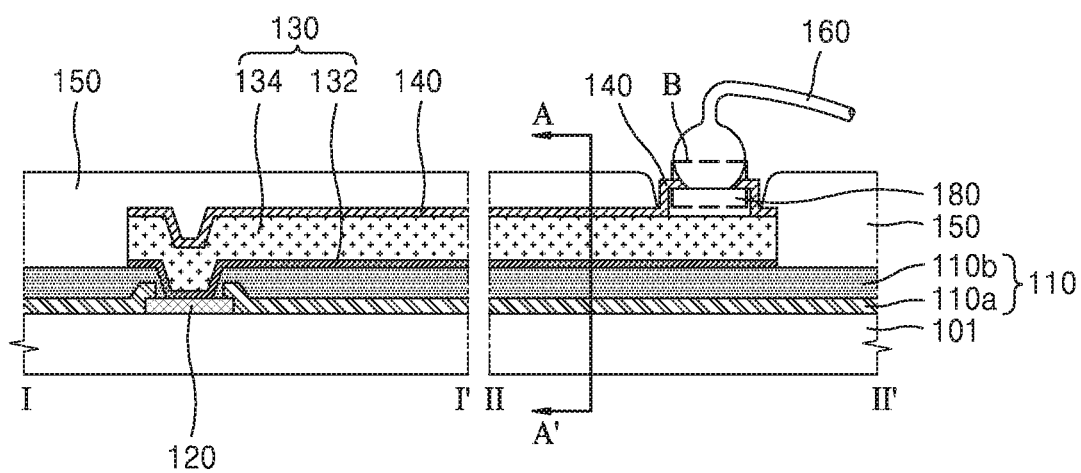
FIGS. 3A to 3D are lateral cross-sectional views taken along line I-I' and line II-IF in FIG. 2, according to embodiments.

FIGS. 3A to 3D are lateral cross-sectional views taken along line I-I' and line II-IF in FIG. 2, according to embodiments. Although the conductive connector 160 is not shown in FIG. 2, the conductive connector 160 is illustrated in FIG. 3A to show a state of the conductive connector 160 connected to a redistribution line conductor 130.

Referring to FIG. 3A, the redistribution line conductor 130 is provided on a semiconductor substrate 101.

The semiconductor substrate 101 is part of the first semiconductor device 20 of FIG. 2. In some embodiments, the semiconductor substrate 101 may include, for example, silicon (Si). Alternatively, the semiconductor substrate 101 may include a semiconductor element, e.g., germanium (Ge), or a compound semiconductor such as silicon carbide (SiC), gallium arsenide (GaAs), indium arsenide (InAs), or indium phosphide (InP).

The semiconductor substrate 101 may have an active side and an inactive side opposite to the active side. In some embodiments, the active side of the semiconductor substrate 101 may face the redistribution line conductor 130. A semiconductor device including various kinds of individual devices may be formed in the active side of the semiconductor substrate 101.

A conductive pad 120 may be provided in the active side of the semiconductor substrate 101 and may be electrically connected internally to at least one of the individual devices. The conductive pad 120 may include a metal material, such as aluminum (Al), copper (Cu), nickel (Ni), cobalt (Co), gold (Au), silver (Ag), or an alloy thereof, having electrical conductivity.

A passivation layer 110 may be provided on the active side of the semiconductor substrate 101 to cover the active side such that the conductive pad 120 is exposed through the passivation layer 110. The passivation layer 110 may expose only a portion of the top surface of the conductive pad 120 or may entirely expose the top surface of the conductive pad 120. The passivation layer 110 may include a single layer, or in some embodiments a multi-layer having at least two layers stacked on each other.

In some embodiments, the passivation layer 110 may include a first passivation layer 110a and a second passivation layer 110b.

Each of the first passivation layer 110a and the second passivation layer 110b may be selected from an organic compound, e.g., photosensitive polyimide (PSPI), and an inorganic compound, such as silicon oxide, silicon nitride, or silicon oxynitride. In some embodiments, the first passivation layer 110a adjacent to the semiconductor substrate 101 may include silicon nitride. In some embodiments, the second passivation layer 110b may include PSPI.

The redistribution line conductor 130 may be provided along the top surface of the passivation layer 110. The redistribution line conductor 130 may horizontally extend along the top surface of the passivation layer 110.

The redistribution line conductor 130 may be electrically connected to the conductive pad 120. In some embodiments, the redistribution line conductor 130 may be physically in direct contact with the conductive pad 120. In some embodiments, the redistribution line conductor 130 may be electrically connected to the conductive pad 120 through one or more conductors.

The redistribution line conductor 130 may include a single layer, or in some embodiments a multi-layer having at least two layers stacked on each other. In some embodiments, the redistribution line conductor 130 may include a metal having relatively low resistivity. In some embodiments, the redistribution line conductor 130 may include a metal having a lower resistivity than Al at 20° C. In some embodiments, the redistribution line conductor 130 may include a metal having a resistivity of about 15 nΩ·m to about 20 nΩ·m at 20° C. In some embodiments, the redistribution line conductor 130 may have Cu as a main component. Here, the term "main component" of the redistribution line conductor 130 denotes a component exceeding 50%, among all components of the redistribution line conductor 130, based on atomic percent.

The redistribution line conductor 130 may include a first redistribution line conductor 132 and a second redistribution line conductor 134. The first redistribution line conductor 132 and the second redistribution line conductor 134 may be stacked in a vertical direction. For example, in some embodiments, the first and second redistribution line conductors 132 and 134 may be stacked on the passivation layer 110. In some embodiments, the first redistribution line conductor 132 may include a seed metal layer for the second redistribution line conductor 134. This will be described in detail below.

In some embodiments, the first redistribution line conductor 132 may include a metal, such as Cu, tungsten (W), titanium (Ti), titanium tungsten (TiW), titanium nitride (TiN), tantalum (Ta), tantalum nitride (TaN), chromium (Cr), Al, indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof. In some embodiments, the second redistribution line conductor 134 may include Cu or an alloy having Cu as a main component. For example, the second redistribution line conductor 134 may include an alloy of Cu and at least one material selected from Ni, Au, Cr, Ti, palladium (Pd), and W.

In some embodiments, the first redistribution line conductor 132 may be omitted and there may only be the second redistribution line conductor 134.

A pad 180 may be provided on the first redistribution line conductor 132. The pad 180 may include a single layer of a conductor such as a metal, or in some embodiments a multi-layer of the conductor. The pad 180 may be exposed through a coating insulator 150, which will be described below. Although the top and side surfaces of the pad 180 are exposed outside the coating insulator 150 in the example illustrated in FIGS. 3A and 3B, in some embodiments only the top surface of the pad 180 may be exposed outside the coating insulator 150.

The pad 180 may include, for example, Al, Cu, zinc (Zn), Ni, Co, W, Ti, Ta, zirconium (Zr), Au, Ag, or an alloy thereof, but embodiments are not limited thereto.

In some embodiments, the pad 180 may be omitted as described below in more detail.

A metal oxide layer 140 may be provided on the second redistribution line conductor 134. In some embodiments, the metal oxide layer 140 may be formed directly on the second redistribution line conductor 134 so as to be in contact with the second redistribution line conductor 134. The metal oxide layer 140 may prevent oxidation of the second redistribution line conductor 134. The metal oxide layer 140 may also extend on the exposed side surfaces and on at least a portion of the exposed top surface of the pad 180, as illustrated in FIG. 3A.

The metal oxide layer 140 may include, for example, an aluminum oxide layer. A metal element of the metal oxide layer 140 may be different from a metal of the second redistribution line conductor 134. In some embodiments, the metal element of the metal oxide layer 140 may not be any one of the metal elements of the second redistribution line conductor 134. For example, in some embodiments, the metal oxide layer 140 may include aluminum oxide and the second redistribution line conductor 134 may not include aluminum.

In some embodiments, the metal oxide layer 140 may have a thickness of about 2 nm to about 30 nm. The thickness may extend orthogonally from the top surface of the redistribution line conductor 130. In some embodiments, the metal oxide layer 140 may have a thickness of about 3 nm to about 50 nm. In other embodiments, the metal oxide layer 140 may have a thickness of about 10 nm to about 20 nm. In still other embodiments, the metal oxide layer 140 may have a thickness of about 5 nm to about 20 nm, or about 5 nm to about 12 nm. The thickness may extend orthogonally from the top surface of the redistribution line conductor 130. The thickness of the metal oxide layer 140 may be measured at one spot on the top surface of the redistribution line conductor 130 or may be an average thickness along the top surface of the redistribution line conductor 130.

When the metal oxide layer 140 is too thin, oxidation of the second redistribution line conductor 134 may not be satisfactorily prevented. When the metal oxide layer 140 is too thick, there may be poor bonding of the metal oxide layer 140 to the second redistribution line conductor 134.

Figure 4A:
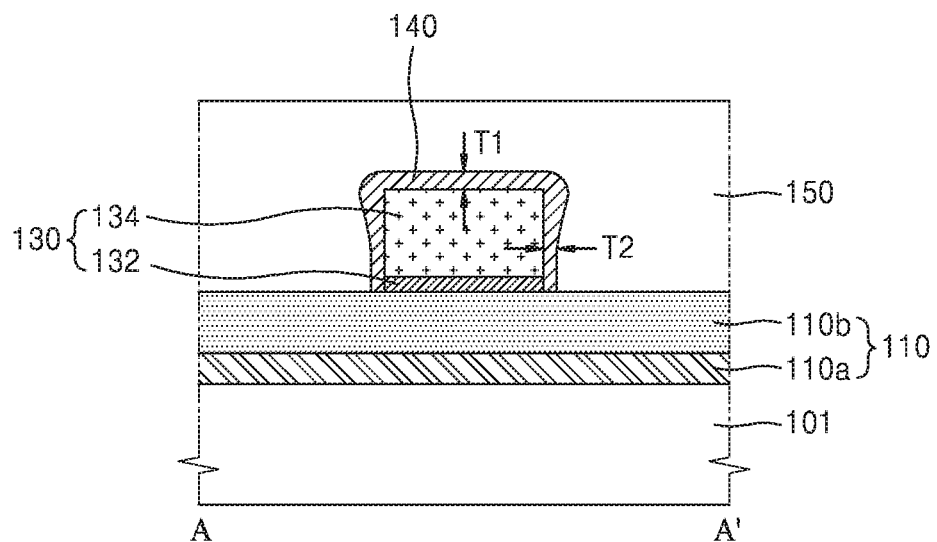
FIGS. 4A and 4B are cross-sectional views of a first semiconductor device, taken along line A-A' in FIG. 3A, according to embodiments.
Figure 4B:
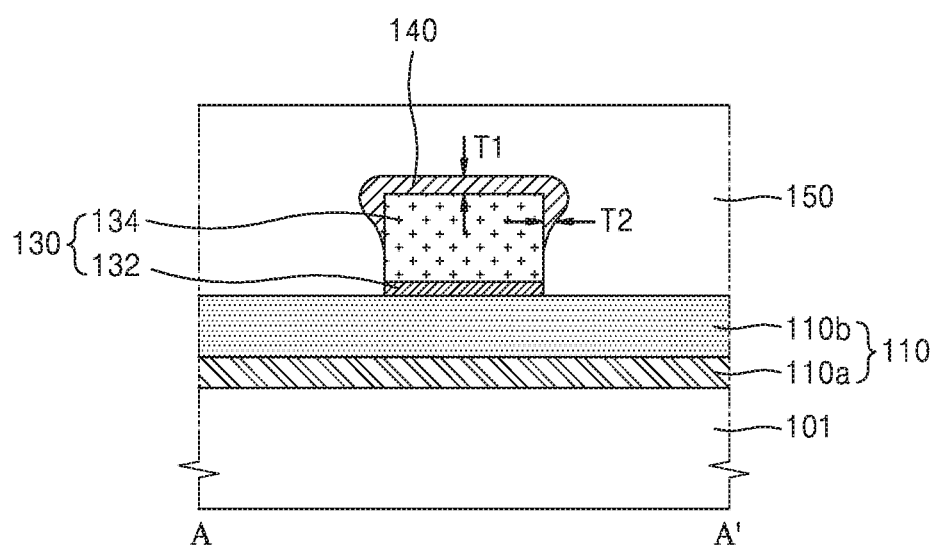

FIGS. 4A and 4B are cross-sectional views of the first semiconductor device 20, taken along line A-A' in FIG. 3A, according to embodiments.

Referring to FIG. 4A, the metal oxide layer 140 may cover the side surfaces of the redistribution line conductor 130 as well as the top surface of the redistribution line conductor 130. The metal oxide layer 140 may have a thickness that varies with a position on the redistribution line conductor 130. The metal oxide layer 140 may have a first thickness T1 on the top surface of the redistribution line conductor 130. The metal oxide layer 140 may have a second thickness T2 on the side surface of the redistribution line conductor 130. The first thickness T1 may be greater than the second thickness T2.

In some embodiments, the first thickness T1 may indicate a thickness of the metal oxide layer 140 at a random spot on the top surface of the redistribution line conductor 130 and the second thickness T2 may indicate a thickness of the metal oxide layer 140 at a random spot on the side surface of the redistribution line conductor 130. In some embodiments, the first thickness T1 may indicate an average thickness of the metal oxide layer 140 on the top surface of the redistribution line conductor 130 and the second thickness T2 may indicate an average thickness of the metal oxide layer 140 on the side surface of the redistribution line conductor 130.

Referring to FIG. 4B, the metal oxide layer 140 may entirely cover the top surface of the redistribution line conductor 130 and only partially cover the side surfaces of the redistribution line conductor 130. In this configuration, the metal oxide layer 140 may have the second thickness T2 that increases from the side surface of the redistribution line conductor 130 toward the top surface of the redistribution line conductor 130, as illustrated in FIG. 4B.

In some embodiments, only a lower side portion of the second redistribution line conductor 134 may not be covered with the metal oxide layer 140 but rather may be exposed. In some embodiments, the entire side surface of the first redistribution line conductor 132 may not be covered with the metal oxide layer 140 but rather may be exposed.

In some embodiments, the metal oxide layer 140 may have the first thickness Ti, which is substantially uniform, on the top surface of the redistribution line conductor 130.

Referring back to FIG. 3A, the coating insulator 150 may be provided to cover the redistribution line conductor 130 and the metal oxide layer 140. The coating insulator 150 may include, for example, an organic compound like PSPI, or an inorganic compound such as silicon oxide, silicon nitride, or silicon oxynitride, or a complex thereof. When the second passivation layer 110b includes PSPI, PSPI may be selected for the coating insulator 150, taking into account the adhesiveness to the second passivation layer 110b. However, embodiments are not limited thereto.

The coating insulator 150 may be patterned to expose the pad 180. Furthermore, the coating insulator 150 may be patterned to expose the redistribution line conductor 130 and a portion of the surface of the metal oxide layer 140. Since PSPI is photosensitive, a specific portion of a coated portion may be selectively patterned using exposure and development.

The conductive connector 160 may be connected to the pad 180 exposed through the coating insulator 150. As shown in FIG. 3A, the metal oxide layer 140 extends along the side surfaces and a portion of the top surfaces of the pad 180 but is not provided between the pad 180 and the conductive connector 160. In some embodiments, when the pad 180 is omitted, the conductive connector 160 may be connected directly to the redistribution line conductor 130 and a portion of the metal oxide layer 140, which are exposed through the coating insulator 150.

Figure 4C:
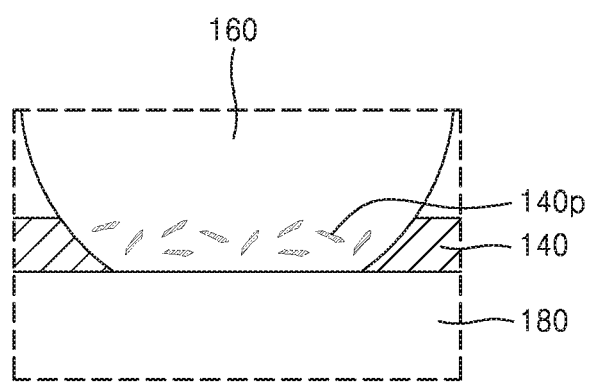
FIG. 4C is an enlarged view of a region B in FIG. 3A in a first semiconductor device, according to embodiments.

FIG. 4C is an enlarged view of a region B in FIG. 3A in the first semiconductor device 20, according to embodiments.

Referring to FIG. 4C, the conductive connector 160 may be connected to the pad 180 exposed through the coating insulator 150. Although the conductive connector 160 is shown as a bonding wire in FIG. 4C, the conductive connector 160 may include a solder bump like a solder ball.

The metal oxide layer 140 may be arranged adjacent to a contact portion between the conductive connector 160 and the pad 180. In some embodiments, metal oxide particles 140p may be distributed in the conductive connector 160. The metal oxide particles 140p may be distributed in the vicinity of the contact portion between the conductive connector 160 and the pad 180. The metal oxide particles 140p may be derived from the metal oxide layer 140. For example, when the metal oxide layer 140 is an aluminum oxide (e.g., $Al_2O_3$) layer, the metal oxide particles 140p may include aluminum oxide particles.

The metal oxide particles 140p may be generated during bonding of the conductive connector 160 to the pad 180. For example, when the conductive connector 160 is a bonding wire and ball bonding is performed in the region B in FIG. 3A, the metal oxide layer 140 at a position where a ball is formed at the tip of a wire bonder and contacting the pad 180 may be broken and changed into the metal oxide particles 140p. The metal oxide particles 140p generated from the breakage of the metal oxide layer 140 may be located in or near a position in which the metal oxide layer 140 is originally located when the conductive connector 160 is bonded to the pad 180.

Figure 3B:
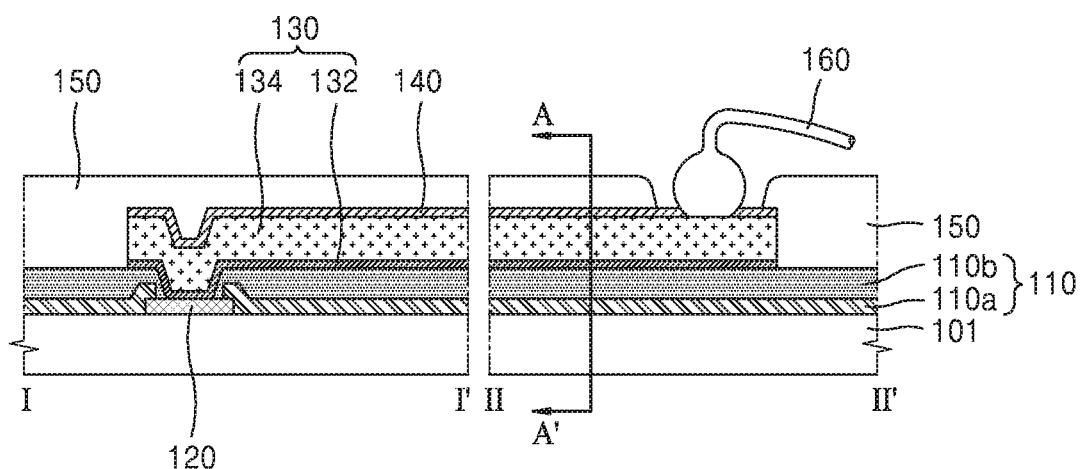
Figure 4D:
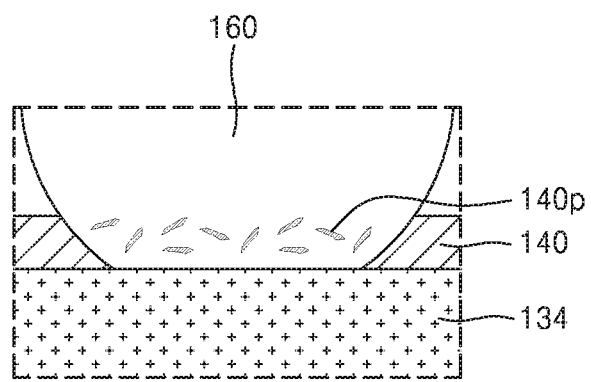
FIG. 4D is an enlarged view of a region B in FIG. 3B in a first semiconductor device, according to embodiments.

FIG. 3B is a lateral cross-sectional view taken along line I-I' and line II-IF in FIG. 2, according to embodiments. FIG. 4D is an enlarged view of a region B in FIG. 3B in the first semiconductor device 20, according to embodiments.

The embodiment illustrated in FIG. 3B is the same as that illustrated in FIG. 3A, except that the pad 180 is omitted. Accordingly, the difference will be focused on in description below and repeated description of like elements with FIG. 3A will be omitted for conciseness.

Referring to FIGS. 3B and 4D, a portion of the redistribution line conductor 130 that is not covered by the coating insulator 150 may function as a pad for the conductive connector 160. Thus, the conductive connector 160 may directly contact the redistribution line conductor 130. In particular, the conductive connector 160 may be directly connected to the second redistribution line conductor 134.

The metal oxide layer 140 may be arranged adjacent to a contact portion between the conductive connector 160 and the second redistribution line conductor 134. In some embodiments, metal oxide particles 140p may be distributed in the conductive connector 160 as described above with reference to FIG. 4C.

Figure 3C:
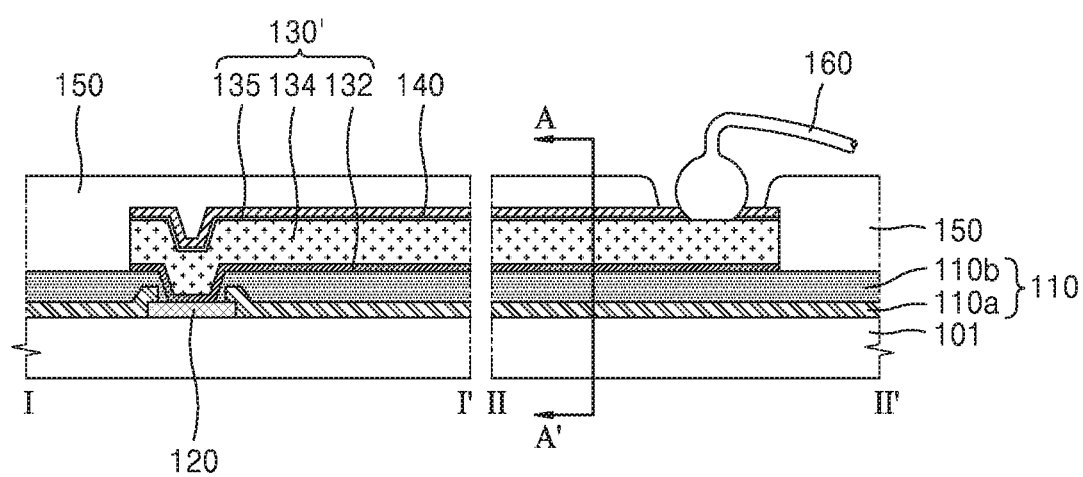
Figure 4E:
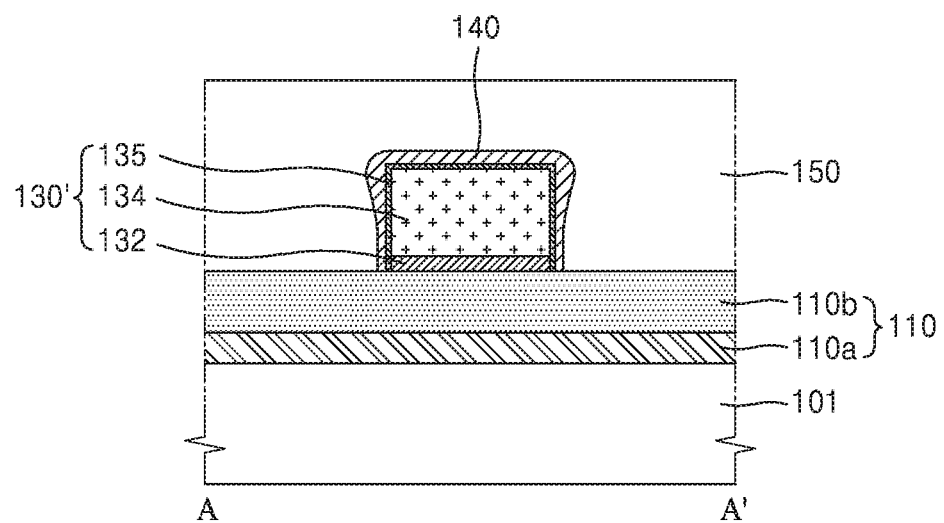
FIG. 4E is a cross-sectional view of the first semiconductor device 20, taken along line A-A' in FIG. 3C, according to embodiments.

FIG. 3C is a lateral cross-sectional view taken along line I-I' and line II-II' in FIG. 2, according to embodiments. FIG. 4E is a cross-sectional view of the first semiconductor device 20, taken along line A-A' in FIG. 3C, according to embodiments.

The embodiment illustrated in FIG. 3C is the same as that illustrated in FIG. 3B, except that the redistribution line conductor 130' further includes the third redistribution line conductor 135 on the second redistribution line conductor 134. Accordingly, the difference will be focused on in description below and repeated description of like elements with FIG. 3B will be omitted for conciseness.

Referring to FIGS. 3C and 4E, the third redistribution line conductor 135 is provided on the second redistribution line conductor 134. The third redistribution line conductor 135 may cover at least a portion of an upper surface of the second redistribution line conductor 134. The third redistribution line conductor 135 may be between the second redistribution line conductor 134 and the metal oxide layer 140. In some embodiments, the third redistribution line conductor 135 may further cover a side surface of the second redistribution line conductor 134.

In some embodiments, the third redistribution line conductor 135 may include a metal such as nickel (Ni), aluminum (Al), cobalt (Co), tungsten (W), palladium (Pd), copper (Cu), tin (Sn) or an alloy thereof.

In some embodiments, the thickness of the third redistribution line conductor 135 may be uniform at the upper surface and at the side surface of the second redistribution line conductor 134.

Referring to FIGS. 3C and 4E, a portion of the redistribution line conductor 130' that is not covered by the coating insulator 150 may function as a pad for the conductive connector 160. Thus, the conductive connector 160 may directly contact the redistribution line conductor 130'. In particular, the conductive connector 160 may be directly connected to the second redistribution line conductor 134.

The metal oxide layer 140 and the third redistribution line conductor 135 may be arranged adjacent to a contact portion between the conductive connector 160 and the second redistribution line conductor 134.

Figure 3D:
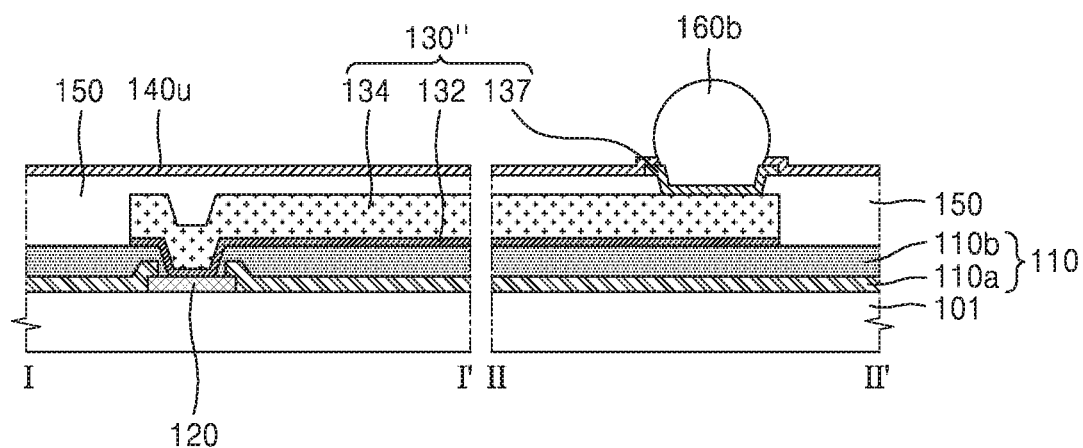

FIG. 3D is a lateral cross-sectional view taken along line I-I' and line II-II' in FIG. 2, according to embodiments.

The embodiment illustrated in FIG. 3D is the same as that illustrated in FIG. 3B, except that the redistribution line conductor 130" further includes a under bump metallurgy (UBM) 137. Accordingly, the difference will be focused on in description below and repeated description of like elements with FIG. 3B will be omitted for conciseness.

Referring to FIG. 3D, the UBM 137 is disposed between the second redistribution line conductor 134 and a conductive connector 160b. In some embodiments, the conductive connector 160b may be a solder bump including Sn, Cu, Ag, Ni, W, Bi, Zn, Ge, Ga, Mo, or an alloy thereof.

The UBM 137 may be a single layer or include a plurality of layers. The UBM 137 may include Cu or an alloy having Cu as a main component. For example, the UBM 137 may include an alloy of Cu and at least one material selected from Ni, Au, Cr, Ti, Pd, and W.

In some embodiments, a metal oxide layer 140u may be on a side surface of the UBM 137. In some embodiments, the metal oxide layer 140u may extend to an upper surface of the UBM 137. In some embodiments, the metal oxide layer 140u may be on an end part of the upper surface of the UBM 137. In some embodiments, the metal oxide layer 140u may extend along an upper surface of the coating insulator 150.

In some embodiments, the conductive connector 160b may not include metal oxide particles 140p as in FIG. 4C. While the conductive connector 160b may be attached to the UBM 137 through the metal oxide layer 140u in the manufacturing process, the metal oxide particles may be reduced by flux added during the bonding process of the conductive connector 160b and diffuse into the conductive connector 160b. However, the present invention is not limited thereto.

Figure 5:
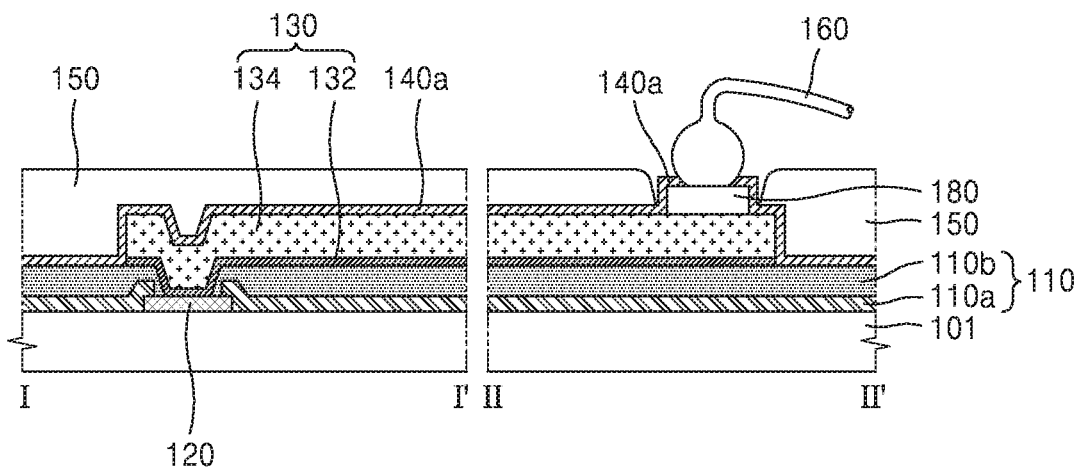
FIG. 5 is a lateral cross-sectional view of a first semiconductor device, taken along line I-I' and line II-IF in FIG. 2, according to an embodiment.

FIG. 5 is a lateral cross-sectional view of the first semiconductor device 20, taken along line I-I' and line II-Ii' in FIG. 2, according to an embodiment.

The embodiment illustrated in FIG. 5 is the same as that illustrated in FIG. 3A, except that a metal oxide layer 140a extends along the top and side surfaces of the redistribution line conductor 130 and the top surface of the passivation layer 110 (particularly, the second passivation layer 110b) as well. Accordingly, the difference will be focused on in description below and repeated description of like elements with FIG. 3A will be omitted for conciseness.

Referring to FIG. 5, the metal oxide layer 140a is formed to cover the top and side surfaces of the redistribution line conductor 130. The metal oxide layer 140a may cover side surfaces in the left and the right of FIG. 5 among the side surfaces of the redistribution line conductor 130. The metal oxide layer 140a may also cover the front and back sides in the direction of a line of sight in FIG. 5 (i.e., the left and right sides of the cross-section views of FIGS. 4A and 4B) among the side surfaces of the redistribution line conductor 130.

The metal oxide layer 140a may extend horizontally and continuously on the passivation layer 110 along the interface between the coating insulator 150 and the passivation layer 110.

Although it is illustrated in FIG. 5 that the thickness of the metal oxide layer 140a is uniform regardless of a position along the metal oxide layer 140a, the thickness of the metal oxide layer 140a may vary with depending on the portion along the metal oxide layer 140a.

Figure 6:
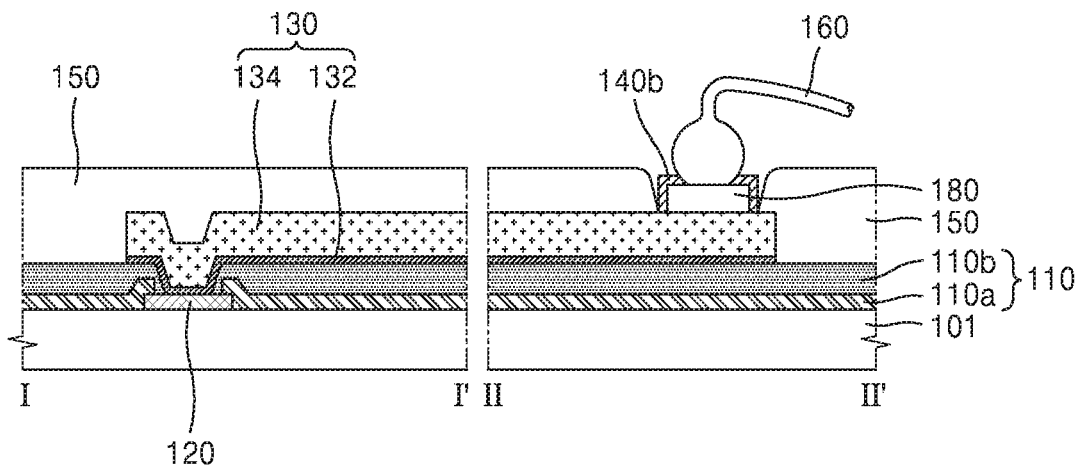
FIG. 6 is a lateral cross-sectional view of a first semiconductor device, taken along line I-I' and line II-IF in FIG. 2, according to an embodiment.

FIG. 6 is a lateral cross-sectional view of the first semiconductor device 20, taken along line I-I' and line II-II' in FIG. 2, according to an embodiment.

The embodiment illustrated in FIG. 6 is the same as that illustrated in FIG. 3A, except that a metal oxide layer 140b is provided on only a portion of the top surface of the redistribution line conductor 130. Accordingly, the difference will be focused on in description below and repeated description of like elements with FIG. 3A will be omitted for conciseness.

Referring to FIG. 6, the metal oxide layer 140b is provided only on a portion of the top surface of the redistribution line conductor 130, the side surfaces of the pad 180, and a portion of the top surface of the pad 180. In particular, the metal oxide layer 140b is only provided in an opening of the coating insulator 150 such that the metal oxide layer 140b may be arranged on a top surface of the redistribution line conductor 130 in the opening of the coating insulator 150, the side surfaces of the pad 180, and a portion of the top surface of the pad 180. As shown in FIG. 6, the pad 180 exposed through the opening of the coating insulator 150 may be bonded to the conductive connector 160, and the metal oxide layer 140b may be arranged on a portion of the top surface of the pad 180 adjacent to a bonded contact portion between the pad 180 and the conductive connector 160, on the side surfaces of the pad 180, and on the top surface of the redistribution line conductor 130 exposed in the opening of the coating insulator 150.

Although not specifically shown in FIG. 6, in some embodiments, the edge of the metal oxide layer 140b may at least partially extend along the side walls of the opening of the coating insulator 150. In other words, the edge of the metal oxide layer 140b may extend to a certain height of the side walls of the opening of the coating insulator 150. As described above, the pad 180 may be omitted in some embodiments. In this case, the conductive connector 160 may be directly connected to the redistribution line conductor 130 and the metal oxide layer 140b may be arranged only on the top surface of the redistribution line conductor 130 that is in the opening of the coating insulator 150. In some embodiments, the top surface of the redistribution line conductor 130 exposed through the opening of the coating insulator 150 may be entirely covered with the bottom surface of the conductive connector 160. In this case, the metal oxide layer 140b may not exist as a layer after the bonding of the conductive connector 160. However, the metal oxide layer 140b that existed in the opening of the coating insulator 150 before connection/bonding of the conductive connector 160 may be changed into metal oxide particles as described above, and thus may exist in the conductive connector 160. The details of the principle of this process have been described above with reference to FIG. 4C and will thus be omitted here.

Figure 7:
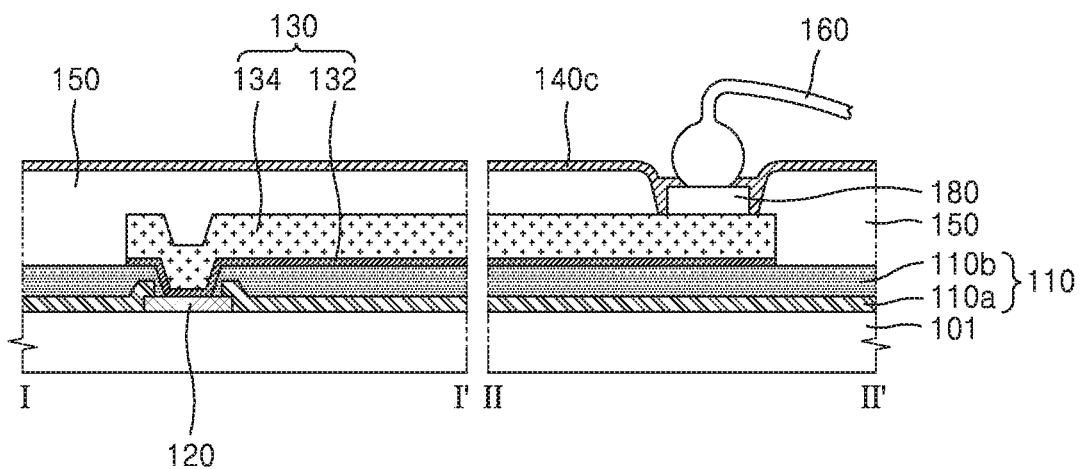
FIG. 7 is a lateral cross-sectional view of a first semiconductor device, taken along line I-I' and line II-IF in FIG. 2, according to an embodiment.

FIG. 7 is a lateral cross-sectional view of the first semiconductor device 20, taken along line I-I' and line II-II' in FIG. 2, according to an embodiment.

The embodiment illustrated in FIG. 7 is the same as that illustrated in FIG. 3A, except that a metal oxide layer 140c extends on the top surface of the coating insulator 150. Accordingly, the difference will be focused on in description below and repeated description of like elements with FIG. 3A will be omitted for conciseness.

Referring to FIG. 7, the metal oxide layer 140c may extend on the top surface of the coating insulator 150 and extend along the side walls of the opening of the coating insulator 150 and the side walls of the pad 180. The opening of the coating insulator 150 may expose a portion of the top surface of the redistribution line conductor 130 and the pad 180. The top surface of the pad 180 exposed through the opening may be connected to the conductive connector 160. The metal oxide layer 140c may extend along the top surface of the coating insulator 150 and the side walls of the opening of the coating insulator 150 until meeting the side surfaces of the conductive connector 160. In some embodiments, the metal oxide layer 140c may extend until meeting the top surface of the redistribution line conductor 130.

In some embodiments, a thickness of the metal oxide layer 140c on the top surface of the coating insulator 150 may be different from a thickness on the side walls of the opening of the coating insulator 150.

In the embodiment illustrated in FIG. 7, the top surface of the redistribution line conductor 130 may be in direct contact with the coating insulator 150. In addition, the side surfaces of the redistribution line conductor 130 may be in direct contact with the coating insulator 150.

Figure 8:
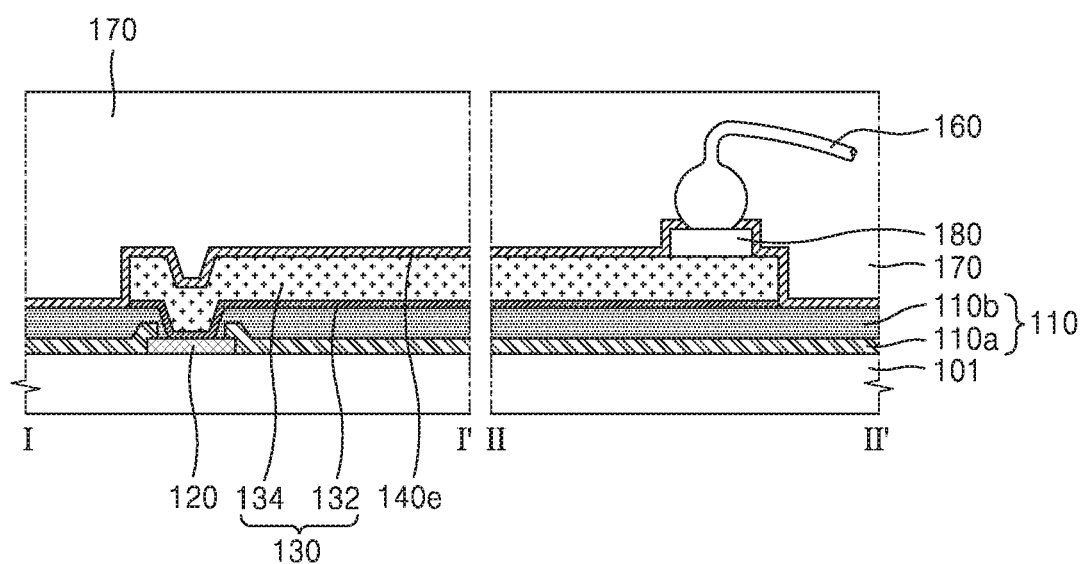
FIG. 8 is a lateral cross-sectional view of a first semiconductor device, taken along line I-I' and line II-IF in FIG. 2, according to an embodiment.

FIG. 8 is a lateral cross-sectional view of the first semiconductor device 20, taken along line I-I' and line II-II' in FIG. 2, according to an embodiment.

The embodiment illustrated in FIG. 8 is the same as that illustrated in FIG. 5, except that the coating insulator 150 (see FIG. 5) is omitted. Accordingly, the difference will be focused on in description below and repeated description of like elements with FIG. 5 will be omitted for conciseness.

Referring to FIG. 8, a metal oxide layer 140e is formed to cover the top and side surfaces of the redistribution line conductor 130. The metal oxide layer 140e may cover side surfaces in the left and the right of FIG. 8 among the side surfaces of the redistribution line conductor 130. The metal oxide layer 140e may also cover the front and back sides in the direction of a line of sight in FIG. 8 (i.e., the left and right sides of the cross-section views of FIGS. 4A and 4B) among the side surfaces of the redistribution line conductor 130.

The metal oxide layer 140e may extend horizontally and continuously on the passivation layer 110 along the interface between the encapsulation material 170 and the passivation layer 110.

Although it is illustrated in FIG. 8 that the thickness of the metal oxide layer 140e is uniform regardless of a position along the metal oxide layer 140e, in some embodiments the thickness of the metal oxide layer 140e may vary with the position along the metal oxide layer 140e.

When the second redistribution line conductor 134 includes copper and the encapsulation material 170 includes an EMC, adhesiveness of copper to the EMC may not be satisfactory. When the metal oxide layer 140e includes metal oxide like aluminum oxide, aluminum oxide has high adhesiveness to copper and to an EMC. Accordingly, even when the coating insulator 150 (see FIG. 5) is omitted and the encapsulation material 170 is directly molded on the metal oxide layer 140e, high reliability may be secured.

FIGS. 9A through 9H are lateral cross-sectional views of stages in a method of fabricating the first semiconductor device 20, taken along line I-I' and line II-II' in FIG. 2, according to an embodiment.

Figure 9A:
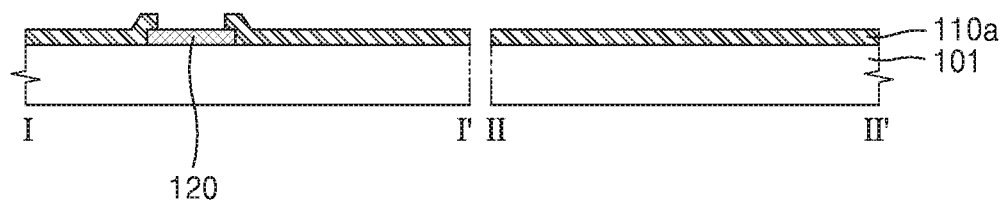

Referring to FIG. 9A, the conductive pad 120 may be formed on the semiconductor substrate 101 and the first passivation layer 110a may be formed to expose at least a portion of the conductive pad 120.

The conductive pad 120 may be formed using plating or vapor deposition. The conductive pad 120 has been described in detail with reference to FIG. 3A, and thus detailed descriptions thereof will be omitted for conciseness.

The first passivation layer 110a may be patterned by forming a layer of an organic compound like PSPI and performing exposure and development. The first passivation layer 110a may be patterned selectively by forming a layer of an inorganic compound such as silicon oxide, silicon nitride, or silicon oxynitride and performing photolithography.

Figure 9B:
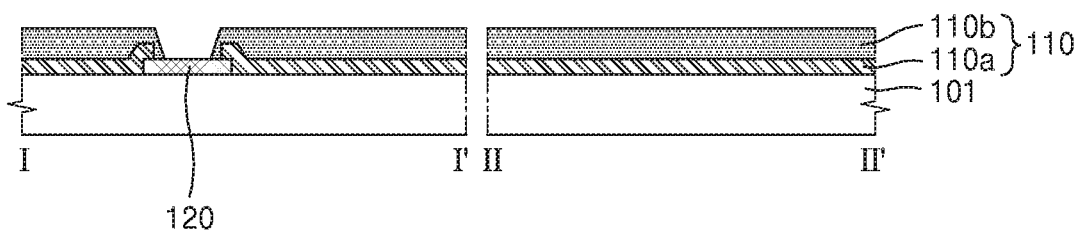

Referring to FIG. 9B, the second passivation layer 110b may be formed on the first passivation layer 110a. The second passivation layer 110b may include PSPI and may be patterned by forming a layer of PSPI and performing exposure and development. The second passivation layer 110b may be patterned selectively by forming a layer of an inorganic compound such as silicon oxide, silicon nitride, or silicon oxynitride and performing photolithography.

Figure 9C:
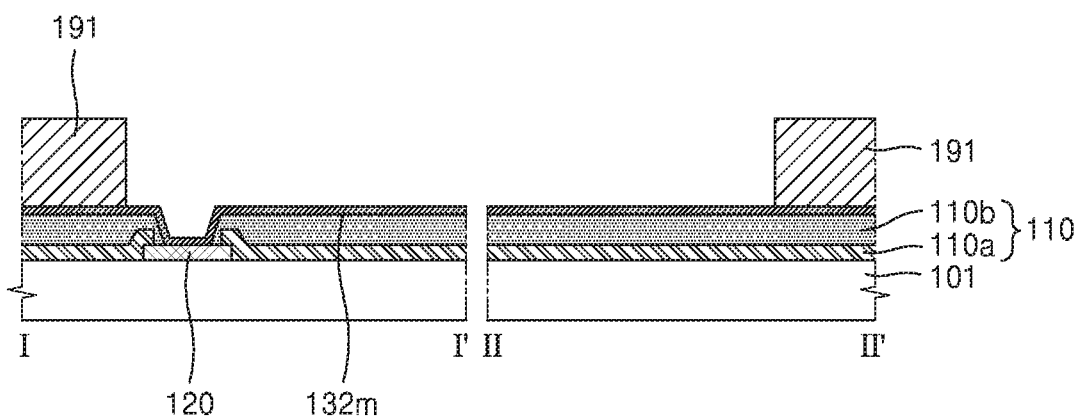

Referring to FIG. 9C, a first redistribution line conductor material layer 132m may be formed on the second passivation layer 110b and an exposed surface of the conductive pad 120, and a mold layer 191 may be formed to expose a portion in which a redistribution line conductor will be formed.

The first redistribution line conductor material layer 132m may include metal, such as Cu, W, Ti, TiW, TiN, Ta, TaN, Cr, Al, In, Mo, Mn, Co, Sn, Ni, Mg, Re, Be, Ga, or Ru, or an alloy thereof. In some embodiments, the first redistribution line conductor material layer 132m may be formed using physical vapor deposition (PVD).

The mold layer 191 may be patterned by forming a layer of a photoresist material and performing exposure and development. The portion of the first redistribution line conductor material layer 132m, in which a redistribution line conductor will be formed, may be exposed through the mold layer 191.

Figure 9D:
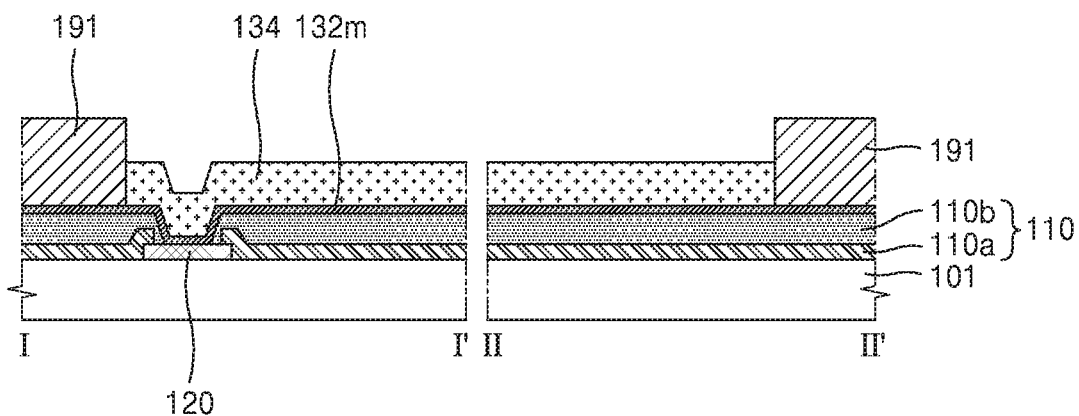

Referring to FIG. 9D, the second redistribution line conductor 134 may be formed by performing plating using the first redistribution line conductor material layer 132m as a seed layer.

The plating may include electroplating or electroless plating. A material of the second redistribution line conductor 134 has been described with reference to FIG. 3A, and thus detailed descriptions thereof will be omitted for conciseness.

Referring to FIG. 9E, the mold layer 191 may be removed, and the first redistribution line conductor 132 may be obtained by removing exposed portions of the first redistribution line conductor material layer 132m. The pad 180 may be formed on the second redistribution line conductor 134.

The mold layer 191 may be removed using, for example, strip or ashing. Thereafter, the exposed portions of the first redistribution line conductor material layer 132m may be removed using wet etch so as to obtain the first redistribution line conductor 132. In some embodiments, removal of the mold layer 191 and removal of the exposed portions of the first redistribution line conductor material layer 132m may be simultaneously performed in a single process.

Thereafter, the pad 180 may be formed on the second redistribution line conductor 134. The pad 180 may be formed using, for example, vapor deposition or plating. In detail, the pad 180 may be formed by forming a mask layer on the second redistribution line conductor 134, performing vapor deposition or plating, and removing the mask.

In some embodiments, the forming of the pad 180 may be omitted.

Referring to FIG. 9F, the metal oxide layer 140 may be formed on the second redistribution line conductor 134 and the pad 180 using PVD. In some embodiments, the metal oxide layer 140 may be formed using sputtering. In some embodiments, the metal oxide layer 140 may be formed using chemical vapor deposition (CVD) or atomic layer deposition (ALD).

When PVD is performed using sputtering, the metal oxide layer 140 may have different thicknesses on the top and side surfaces of the redistribution line conductor 130. This has been described with reference to FIGS. 4A and 4B, and thus detailed descriptions thereof will be omitted for conciseness.

In some embodiments, the metal oxide layer 140 may be also formed on an exposed top surface of the passivation layer 110. In some embodiments, the metal oxide layer 140 may be patterned to be formed only on the top surface of the redistribution line conductor 130.

Referring to FIG. 9G, the coating insulator 150 may be formed to cover the redistribution line conductor 130 and the metal oxide layer 140. The coating insulator 150 may have an opening OP. The opening OP may partially expose the redistribution line conductor 130 and the metal oxide layer 140. The opening OP may also at least partially expose the top surface of the pad 180. In some embodiments, the opening OP may expose the side surfaces and the top surface of the pad 180. In some embodiments, the opening OP may expose only the top surface of the pad 180.

The coating insulator 150 may be patterned by forming a layer of an organic compound like PSPI and performing exposure and development.

In some embodiments, the forming of the coating insulator 150 may be omitted.

Figure 9H:
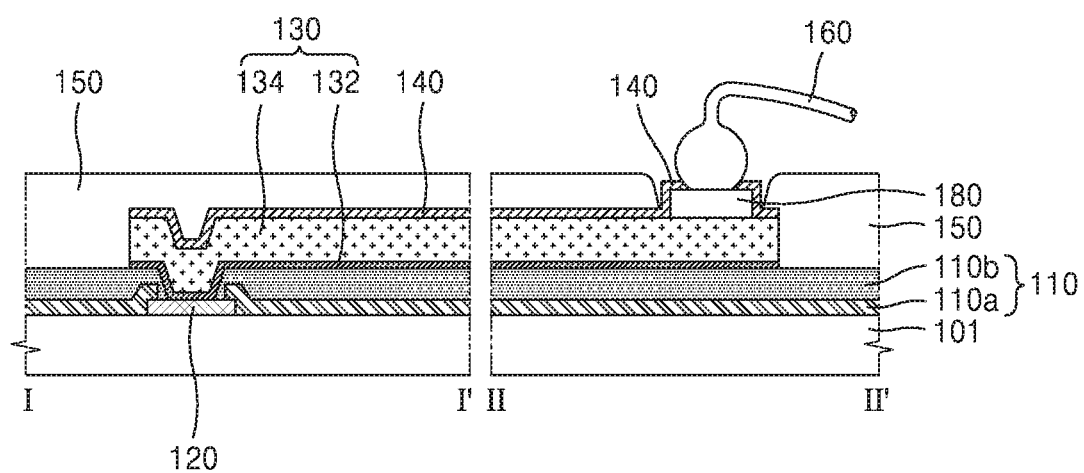

Referring to FIG. 9H, the redistribution line conductor 130 may be electrically connected to the internal pad 6 (see FIG. 1) by wire-bonding the conductive connector 160 to the pad 180 exposed through the opening OP.

As described above with reference to FIG. 4C, when the conductive connector 160 is ball-bonded to the pad 180, a ball of the conductive connector 160 may break the metal oxide layer 140 so that the conductive connector 160 is in direct contact with the pad 180.

When the pad 180 is omitted, the conductive connector 160 may be wire-bonded to the redistribution line conductor 130 and the metal oxide layer 140, which are exposed through the opening OP.

Thereafter, the first semiconductor device 20 may be entirely encapsulated with an encapsulation material like an EMC, and accordingly, the semiconductor package 100 of FIG. 1 may be obtained.

Figure 10:
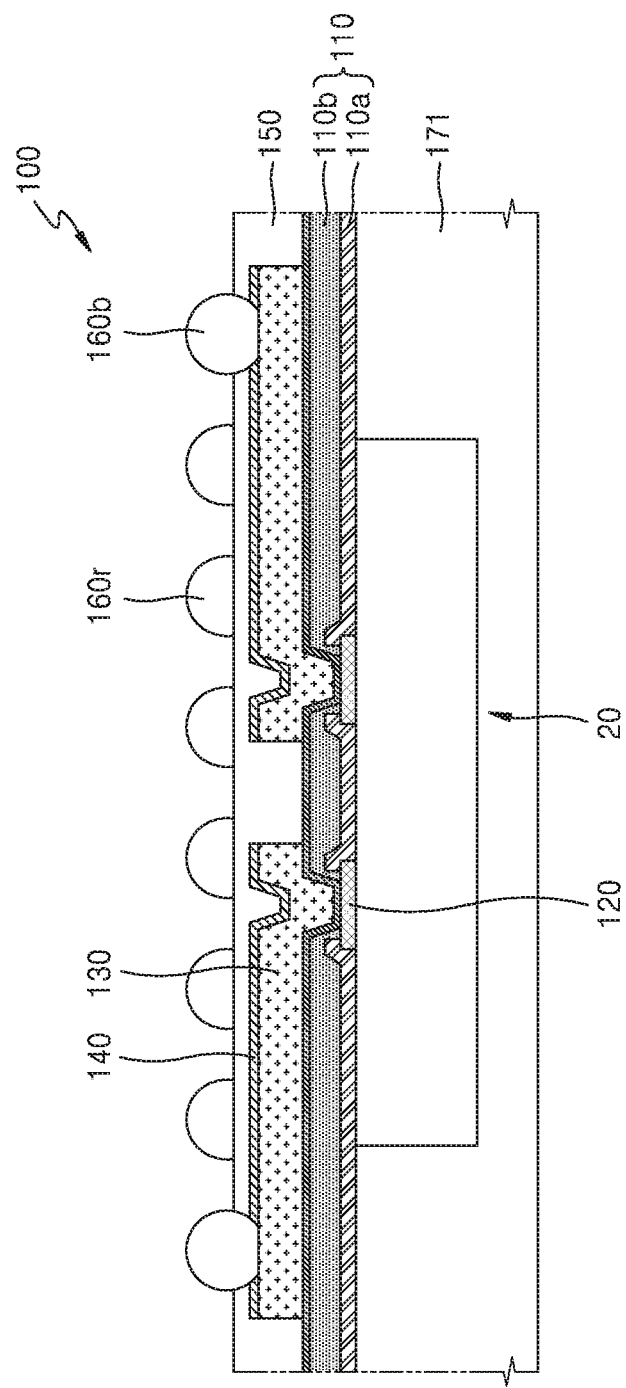
FIG. 10 is a lateral cross-sectional view of a semiconductor package according to embodiment.

FIG. 10 is a lateral cross-sectional view of the semiconductor package 100 according to an embodiment.

The semiconductor package 100 of FIG. 10 is the same as the semiconductor package 100 of FIG. 1, except for a flip chip structure, and thus the difference will be focused on in description below and redundant descriptions will be omitted for conciseness.

Referring to FIG. 10, a solder bump instead of a bonding wire may be formed, as a conductive connector 160*b* or 160*r*, on the redistribution line conductor 130 exposed through the coating insulator 150. The solder bump may include an alloy having Sn as a main component. For example, the solder bump may include an alloy of Sn, Ag, and Cu.

It is illustrated in the cross-sectional view of FIG. 10 that the conductive connector 160*b* is connected to the redistribution line conductor 130 and the conductive connector 160*r*, which is located farther away in the direction of a line of sight, is connected to another redistribution line conductor that is not shown in the cross-sectional view.

According to various embodiments, the redistribution line conductor 130 and the metal oxide layer 140 on the top surface of the redistribution line conductor 130 have high adhesiveness to a solder bump.

In some embodiments, the coating insulator 150 may not be in direct contact with an encapsulation material 171. The encapsulation material 171 may be in contact with a surface of the passivation layer 110 (particularly, the first passivation layer 110*a*).

Figure 11A:
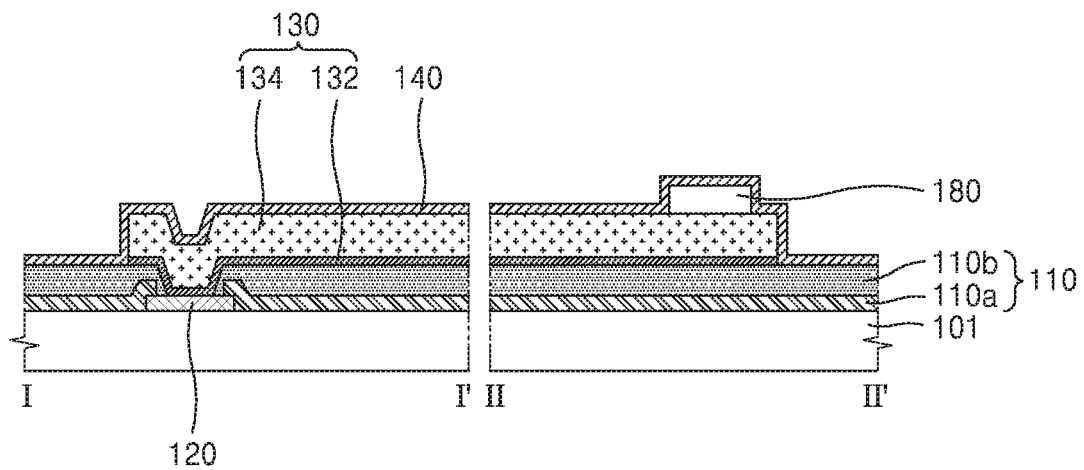
FIGS. 11A and 11B are lateral cross-sectional views of stages in a method of fabricating the first semiconductor device of FIG. 5.
Figure 11B:
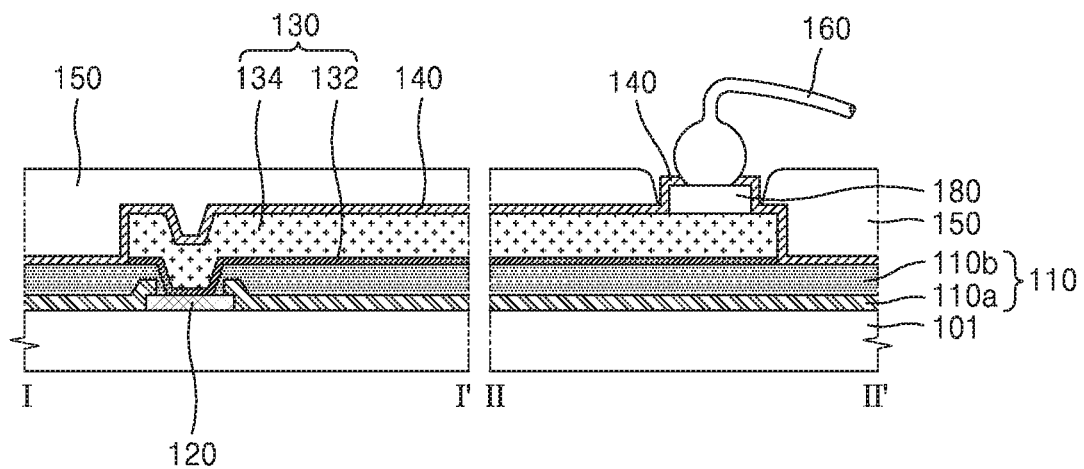

FIGS. 11A and 11B are lateral cross-sectional views of stages in a method of fabricating the first semiconductor device 20 of FIG. 5. The method of fabricating the first semiconductor device 20 of FIG. 5 may include the stages described with reference to FIGS. 9A through 9E, and FIG. 11A may show a stage following the stage shown in FIG. 9E. Repeated descriptions of like elements are omitted for conciseness.

Referring to FIG. 11A, the metal oxide layer 140 may be formed on an entire exposed surface using PVD sputtering. In detail, the metal oxide layer 140 may be formed on the top surface and side surfaces of the pad 180, the top surface and side surfaces of the second redistribution line conductor 134, the side surfaces of the first redistribution line conductor 132, and the exposed top surface of the passivation layer 110.

The metal oxide layer 140 may be patterned as in the embodiment described with reference to FIG. 9F, but in some embodiments the patterning may be omitted here.

Referring to FIG. 11B, the coating insulator 150 may be formed, and the conductive connector 160 may be formed. The forming of the coating insulator 150 and the forming of the conductive connector 160 have been described with reference to FIGS. 9G and 9H, respectively, and thus detailed descriptions thereof will be omitted for conciseness.

Figure 12A:
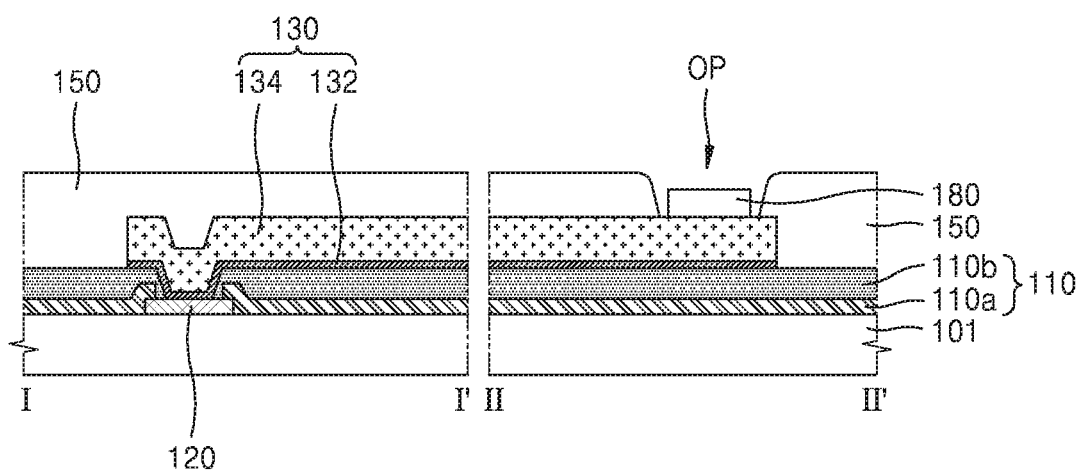
FIGS. 12A and 12B are lateral cross-sectional views of stages in a method of fabricating the first semiconductor device of FIG. 7.
Figure 12B:
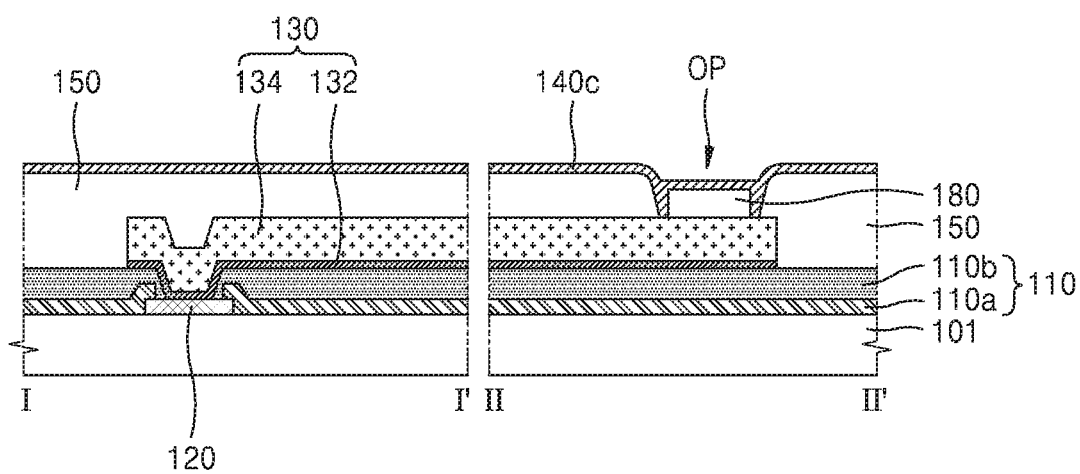

FIGS. 12A and 12B are lateral cross-sectional views of stages in a method of fabricating the first semiconductor device 20 of FIG. 7. The method of fabricating the first semiconductor device 20 of FIG. 7 may include the stages described with reference to FIGS. 9A through 9E, and FIG. 12A may show a stage following the stage shown in FIG. 9E. Repeated descriptions of like elements are omitted for conciseness.

Referring to FIG. 12A, in a state where the metal oxide layer 140 has not been formed, the coating insulator 150 having the opening OP may be formed first. A method of forming the coating insulator 150 has been described with reference to FIG. 9G, and thus detailed descriptions thereof will be omitted for conciseness.

Referring to FIG. 12B, the metal oxide layer 140*c* may be formed on the top surface of the coating insulator 150. The metal oxide layer 140*c* may extend to the opening OP. Furthermore, the metal oxide layer 140*c* may cover the top surface of the redistribution line conductor 130 exposed through the opening OP and the side and top surfaces of the pad 180.

Thereafter, when a conductive connector is formed in the opening, the first semiconductor device 20 of FIG. 7 may be manufactured.

Alternatively, when the metal oxide layer 140*c* is removed from the top surface of the coating insulator 150 such that the metal oxide layer 140*c* is formed only in the opening OP (i.e., the side walls of the opening OP, the top surface of the redistribution line conductor 130 exposed through the opening OP, and the side surfaces and the top surface of the pad 180) and a conductive connector 160 is formed, the first semiconductor device 20 of FIG. 6 may be manufactured.

Figure 13:
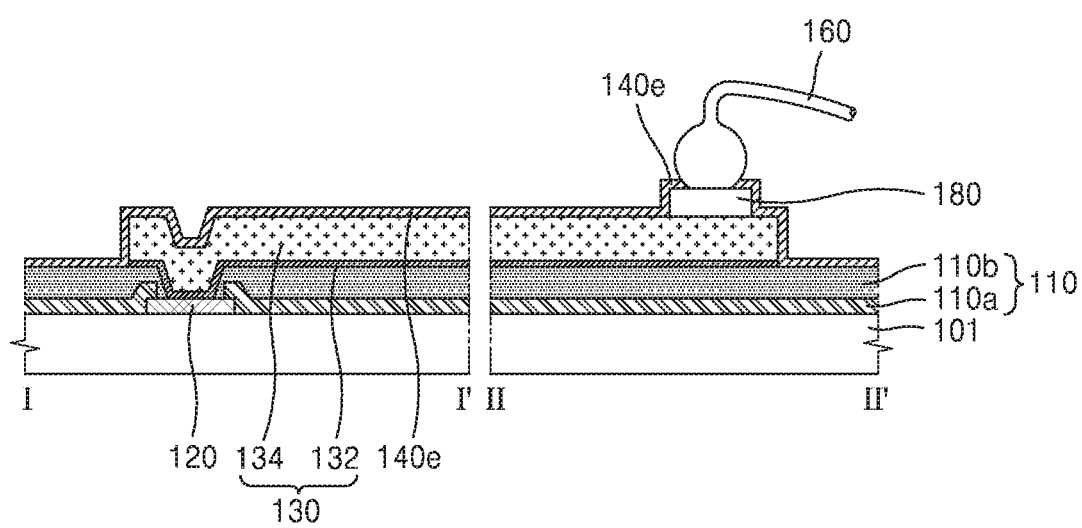
FIG. 13 is a lateral cross-sectional view of a stage in a method of fabricating the first semiconductor device of FIG. 8.

FIG. 13 is a lateral cross-sectional view of a stage in a method of fabricating the first semiconductor device 20 of FIG. 8. The method of fabricating the first semiconductor device 20 of FIG. 8 may include the stages described with reference to FIGS. 9A through 9E. After the stage shown in FIG. 9E, the stage shown in FIG. 11A may be performed, and the stage shown in FIG. 13 may follow the stage shown in FIG. 11A. Repeated descriptions of like elements are omitted for conciseness.

Referring to FIG. 13, the conductive connector 160 may be formed in a state where the coating insulator 150 is omitted. Since the coating insulator 150 is omitted, the opening OP does not exist, and the conductive connector 160 may be connected to the pad 180. As described above, the pad 180 may be omitted. When the pad 180 is omitted, the conductive connector 160 may be connected directly to the redistribution line conductor 130 at a random position on the top surfaces of the redistribution line conductor 130 and the metal oxide layer 140*e*.

Figure 14:
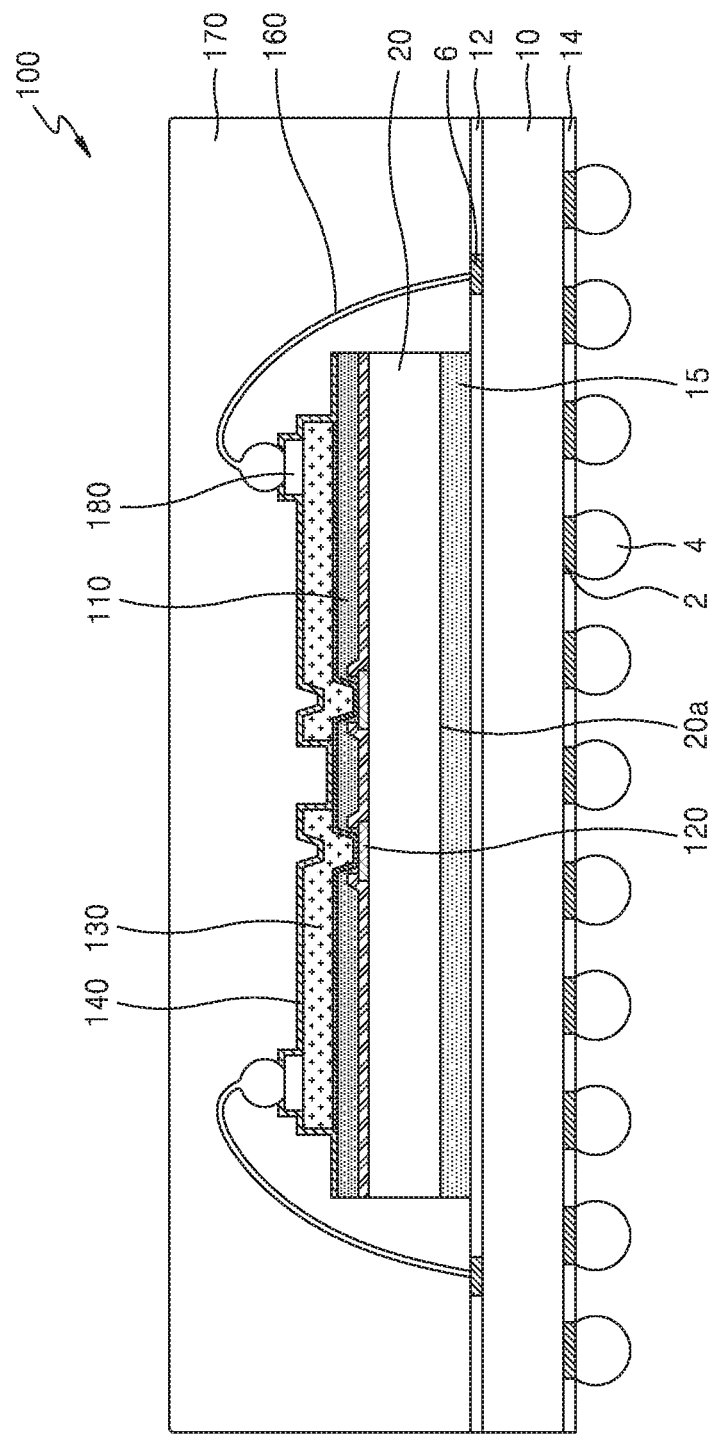
FIG. 14 is a lateral cross-sectional view of a semiconductor package according to an embodiment.

Thereafter, the encapsulation material 170 may be formed for encapsulation so that the semiconductor package 100 of FIG. 14 may be obtained.

FIG. 14 is a lateral cross-sectional view of the semiconductor package 100 according to an embodiment.

Referring to FIG. 14, the metal oxide layer 140 may be in direct contact with the encapsulation material 170. The metal oxide layer 140 may cover the top surface and side surfaces of the redistribution line conductor 130. Furthermore, the metal oxide layer 140 may cover the exposed top surface of the passivation layer 110. In some embodiments, the metal oxide layer 140 may not extend to the side surfaces of the passivation layer 110 and/or the side surfaces of the first semiconductor device 20.

In some embodiments, the metal oxide layer 140 may horizontally extend along the interface between the passivation layer 110 and the encapsulation material 170. Although the pad 180 is provided on the redistribution line conductor 130 in FIG. 14, the pad 180 may be omitted in some embodiments. When the pad 180 is omitted, the conductive connector 160 may be directly connected to the redistribution line conductor 130. This has been described with reference to FIG. 8, and thus detailed descriptions thereof are omitted here for conciseness.

While the inventive concept has been particularly shown and described with reference to various embodiments thereof, it will be understood that various changes in form and details may be made therein without departing from the spirit and scope of the following claims.

What is claimed is:

1. A semiconductor package comprising:
a semiconductor substrate;
a conductive pad on the semiconductor substrate;
a redistribution line conductor electrically connected to the conductive pad;
a coating insulator that covers the redistribution line conductor and partially exposes the redistribution line conductor; and
an aluminum oxide layer provided below the coating insulator and extending along a top surface of the redistribution line conductor, the aluminum oxide layer being in contact with the redistribution line conductor, wherein the aluminum oxide layer extends to side surfaces of the redistribution line conductor and has a first thickness on the top surface of the redistribution line conductor and a second thickness on side surfaces of the redistribution line conductor, and the first thickness is greater than the second thickness.

2. The semiconductor package of claim 1, wherein the redistribution line conductor includes copper.

3. The semiconductor package of claim 2, wherein a thickness of the aluminum oxide layer is about 3 nm to about 50 nm.

4. The semiconductor package of claim 2, wherein a thickness of the aluminum oxide layer is about 5 nm to about 20 nm.

5. The semiconductor package of claim 1, further comprising
a conductive connector that contacts a portion of the redistribution line conductor that is exposed, wherein aluminum oxide particles are distributed in a contact portion between the redistribution line conductor and the conductive connector.

6. The semiconductor package of claim 5, wherein the aluminum oxide layer is adjacent to the contact portion.

7. The semiconductor package of claim 5, wherein the aluminum oxide particles in the contact portion are derived from the aluminum oxide layer.

8. The semiconductor package of claim 1, wherein the redistribution line conductor has a resistivity of about 15 nΩ·m to about 20 nΩ·m at 20 ° C.

9. The semiconductor package of claim 1, further comprising
a passivation layer that covers the semiconductor substrate and exposes the conductive pad,
wherein the redistribution line conductor extends on the passivation layer and is connected to the conductive pad that is exposed.

10. The semiconductor package of claim 9, wherein the aluminum oxide layer continuously extends on side surfaces of the redistribution line conductor and a top surface of the passivation layer.

11. The semiconductor package of claim 10, wherein the aluminum oxide layer extends along an interface between the passivation layer and the coating insulator.

12. A semiconductor package comprising:
a semiconductor substrate;
a conductive pad on the semiconductor substrate;
a redistribution line conductor that is electrically connected to the conductive pad, the redistribution line conductor including copper;
a coating insulator that covers the redistribution line conductor and partially exposes the redistribution line conductor;
a conductive connector that contacts a portion of the redistribution line conductor that is exposed; and
a metal oxide layer that is provided on the redistribution line conductor and that surrounds the conductive connector,
wherein a metal of the metal oxide layer is different from a main component of the redistribution line conductor.

13. The semiconductor package of claim 12, wherein the metal oxide layer extends along a top surface of the coating insulator.

14. The semiconductor package of claim 12, wherein the metal of the metal oxide layer is aluminum.

15. The semiconductor package of claim 12, wherein the coating insulator includes a photosensitive polyimide (PSPI).

16. The semiconductor package of claim 12, wherein the metal oxide layer is arranged directly on the redistribution line conductor.

17. The semiconductor package of claim 16, wherein the metal oxide layer is a sputtered metal oxide layer having a non-uniform thickness over the metal oxide layer.

18. A semiconductor package comprising:
a semiconductor substrate;
a conductive pad on the semiconductor substrate;
a redistribution line conductor that is electrically connected to the conductive pad and that includes copper as a main component;
a conductive connector that contacts a portion of the redistribution line conductor; and
an aluminum oxide layer formed directly on the redistribution line conductor,
wherein aluminum oxide particles are distributed in a contact portion between the redistribution line conductor and the conductive connector.

* * * * *